United States Patent
Scarbrough et al.

(10) Patent No.: US 12,230,325 B2
(45) Date of Patent: Feb. 18, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: Alyssa N. Scarbrough, Boise, ID (US); John D. Hopkins, Meridian, ID (US); Collin Howder, Boise, ID (US); Jordan D. Greenlee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 451 days.

(21) Appl. No.: 17/409,300

(22) Filed: Aug. 23, 2021

(65) Prior Publication Data
US 2023/0055319 A1    Feb. 23, 2023

(51) Int. Cl.
*H01L 21/768* (2006.01)
*G11C 16/04* (2006.01)
(Continued)

(52) U.S. Cl.
CPC ......... *G11C 16/0483* (2013.01); *H10B 41/10* (2023.02); *H10B 41/27* (2023.02);
(Continued)

(58) Field of Classification Search
CPC .... G11C 16/0483; H10B 41/10; H10B 41/27; H10B 41/35; H10B 43/10; H10B 43/27; H10B 43/35
See application file for complete search history.

(56) References Cited

U.S. PATENT DOCUMENTS 9,461,063 B1 * 10/2016 Lai ................... H10B 43/27
9,941,293 B1 *  4/2018 Pang .................. H10B 41/27
(Continued)

FOREIGN PATENT DOCUMENTS

CN    109712987 A  *  5/2019
TW    202036856       10/2020

OTHER PUBLICATIONS

U.S. Appl. No. 17/409,355, filed Aug. 23, 2021, by Scarbrough et al.
(Continued)

*Primary Examiner* — Samuel Park
(74) *Attorney, Agent, or Firm* — Wells St. John P.S.

(57) ABSTRACT

A method used in forming a memory array comprising strings of memory cells comprises forming a lower portion of a stack that will comprise vertically-alternating first tiers and second tiers. The stack comprises laterally-spaced memory-block regions. Material of the first tiers is of different composition from material of the second tiers. The lower portion comprises an upper second tier comprising insulative material. The vertically-alternating first tiers and second tiers of an upper portion of the stack are formed above the lower portion. Channel-material strings are formed that extend through the upper portion to the lower portion. Horizontally-elongated lines are formed in the upper second tier longitudinally-along opposing lateral edges of the memory-block regions. Material of the lines is of different composition from that of the insulative material in the upper second tier that is laterally-between the lines. Horizontally-elongated trenches are formed into the stack that are individually between immediately-laterally-adjacent of the memory-block regions and that extend through the upper portion to the lower portion. Other embodiments, including structure independent of method, are disclosed.

22 Claims, 14 Drawing Sheets

(51) Int. Cl.
*H10B 41/10* (2023.01)
*H10B 41/27* (2023.01)
*H10B 41/35* (2023.01)
*H10B 43/10* (2023.01)
*H10B 43/27* (2023.01)
*H10B 43/35* (2023.01)

(52) U.S. Cl.
CPC ............. *H10B 41/35* (2023.02); *H10B 43/10* (2023.02); *H10B 43/27* (2023.02); *H10B 43/35* (2023.02)

(56) References Cited

U.S. PATENT DOCUMENTS

| | | | |
|---|---|---|---|
| 10,014,309 | B2 | 7/2018 | Dorhout et al. |
| 2015/0236038 | A1 | 8/2015 | Pachamuthu et al. |
| 2016/0035742 | A1* | 2/2016 | Kanakamedala ...... H10B 43/35 438/264 |
| 2018/0006052 | A1 | 1/2018 | Hwang |
| 2018/0122904 | A1* | 5/2018 | Matsumoto ............ H10B 43/27 |
| 2018/0286874 | A1* | 10/2018 | Kim ...................... H10B 43/35 |
| 2019/0280001 | A1* | 9/2019 | Terasawa .......... H01L 21/76865 |
| 2020/0051997 | A1 | 2/2020 | Park |
| 2020/0127004 | A1 | 4/2020 | Dorhout et al. |
| 2020/0135749 | A1 | 4/2020 | Hwang et al. |
| 2020/0168622 | A1 | 5/2020 | Fukuzumi et al. |
| 2020/0295033 | A1 | 9/2020 | Sakamoto et al. |
| 2020/0402905 | A1 | 12/2020 | Otsu et al. |
| 2021/0057441 | A1 | 2/2021 | Xu et al. |
| 2021/0151460 | A1 | 5/2021 | Kim et al. |
| 2021/0217761 | A1 | 7/2021 | Tiwari |
| 2021/0233779 | A1 | 7/2021 | Kang et al. |
| 2022/0199767 | A1* | 6/2022 | Lee ...................... H01L 29/0638 |
| 2023/0052468 | A1 | 2/2023 | Barclay et al. |

OTHER PUBLICATIONS

U.S. Appl. No. 17/508,143, filed Oct. 22, 2021, by Scarbrough et al.
U.S. Appl. No. 17/398,188, filed Aug. 10, 2021, by Scarbrough et al.
U.S. Appl. No. 17/398,283, filed Aug. 11, 2021, by Barclay et al.
U.S. Appl. No. 17/231,895, filed Apr. 15, 2021, by Chandolu et al.

* cited by examiner

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between, A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass integrated circuitry comprising a memory array comprising strings of memory cells (e.g., NAND architecture) independent of method of manufacture. First example method embodiments are described with reference to FIGS. 1-22.

Figure 1:
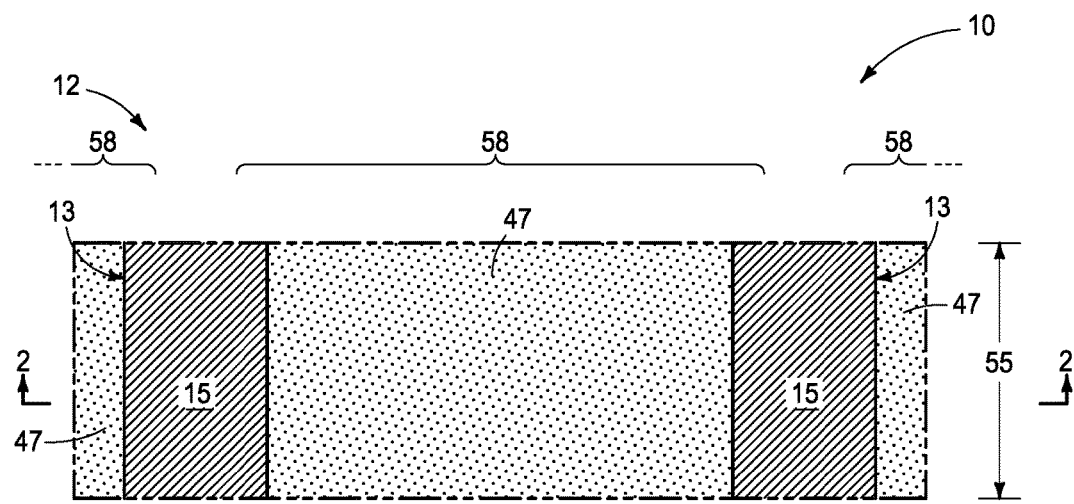
FIGS. 1 and 2 are diagrammatic cross-sectional views of portions of a construction that will comprise an array of elevationally-extending strings of memory cells in accordance with an embodiment of the invention.
Figure 2:
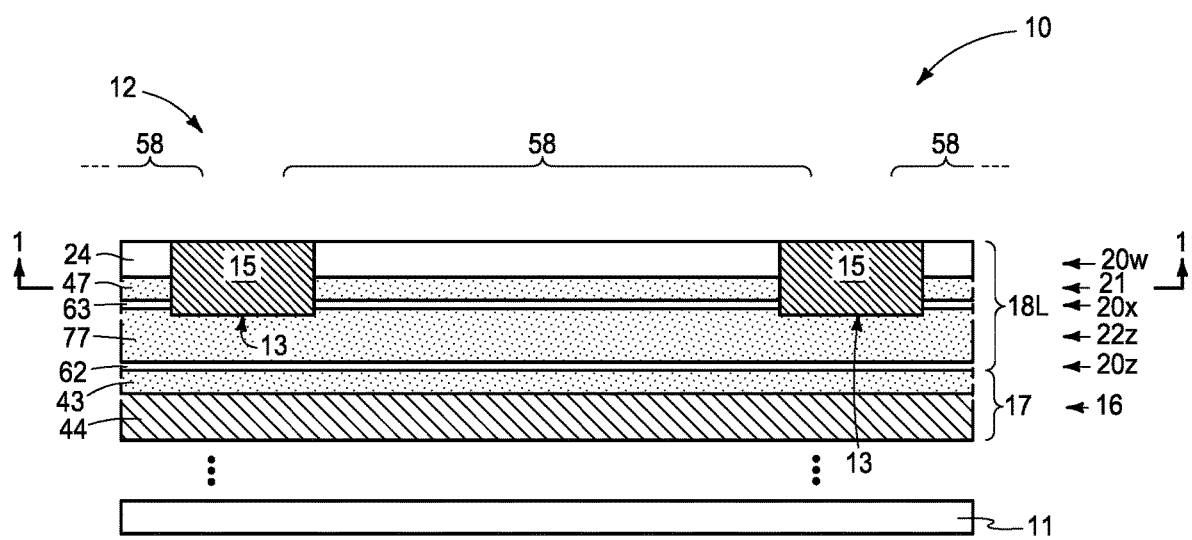

FIGS. 1 and 2 show an example construction 10 having an array 12 in which elevationally-extending strings of transistors and/or memory cells will be formed. Such includes a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2—depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

In one embodiment, a conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. In one embodiment, upper conductor material 43 comprises conductively-doped semiconductive material (e.g., n-type-doped or p-type-doped polysilicon). In one embodiment, lower conductor material 44 comprises metal material (e.g., a metal silicide such as WSi$_x$). Conductor tier 16 may comprise part of control circuitry (e.g., peripheral-under-array circuitry and/or a common source line or plate) used to control read and write access to the transistors and/or memory cells that will be formed within array 12.

A lower portion 18L of a stack 18* has been formed above substrate 11 and conductor tier 16 (an * being used as a suffix to be inclusive of all such same-numerically-designated components that may or may not have other suffixes). Stack 18* will comprise vertically-alternating conductive tiers 22* and insulative tiers 20*, with material of tiers 22* being of different composition from material of tiers 20*. Stack 18* comprises laterally-spaced memory-block regions 58 that will comprise laterally-spaced memory blocks 58 in a finished circuitry construction. In this document, unless otherwise indicated, "block" is generic to include "sub-block". Memory-block regions 58 and resultant memory blocks 58 (not yet shown) may be considered as being longitudinally elongated and oriented, for example along a direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, lower portion 18L comprises a lowest tier 20z of second tiers 20* directly above (e.g., directly against) conductor material 17. Example lowest second tier 20z is insulative and may be sacrificial (e.g., comprising material 62, for example silicon dioxide and/or silicon nitride). A next-lowest second tier 20x of second tiers 20* is directly above lowest second tier 20z and may be sacrificial (e.g., comprising material 63, for example silicon dioxide and/or silicon nitride). A lowest tier 22z of first tiers 22* comprising sacrificial material 77 (e.g., polysilicon or silicon nitride) is vertically between lowest second tier 20z and next-lowest second tier 20x. In one embodiment, lower portion 18L comprises a conducting-material tier 21 comprising conducting material 47 (e.g., conductively-doped polysilicon) that is directly above next-lowest second tier 20x. Lower portion 18L comprises an upper second tier 20w (e.g., a next-next lowest second tier) comprising insulative material 24. In one embodiment, insulative material 24 comprises silicon dioxide and in one such embodiment that is undoped (i.e., from no-detectable dopant therein to total dopant concentration no greater than $1 \times 10^{10}$ atoms/cm$^3$ of dopant). Additional tiers may be present. In one embodiment, lower portion 18L at least as initially formed comprises multiple first/conductive tiers (e.g., 22z and 21) and multiple second/insulative tiers (e.g., 20z, 20x, 20w). In one embodiment and as shown, upper second tier 20w is the uppermost second tier 20* in lower portion 18L.

In one embodiment, lower portion 18L comprises sacrificial rails 13 comprising material 15 that are individually between immediately-laterally-adjacent memory-block regions 58 (e.g., directly under where trenches will be formed as described below). Sacrificial rails 13 may taper laterally-inward or laterally-outward moving deeper into lower stack portion 18L (not shown) Material 15 may comprise conductive material (e.g., comprising one or both of conductively-doped semiconductor material or metal material), insulative material, and/or semiconductive material.

Horizontally-elongated lines are formed in the upper second tier longitudinally-along opposing lateral edges of the memory-block regions, with material of the lines being of different composition from that of the insulative material in the upper second tier that is laterally-between the lines. An example manner of doing so is described with reference to FIGS. 3-8.

Figure 3:
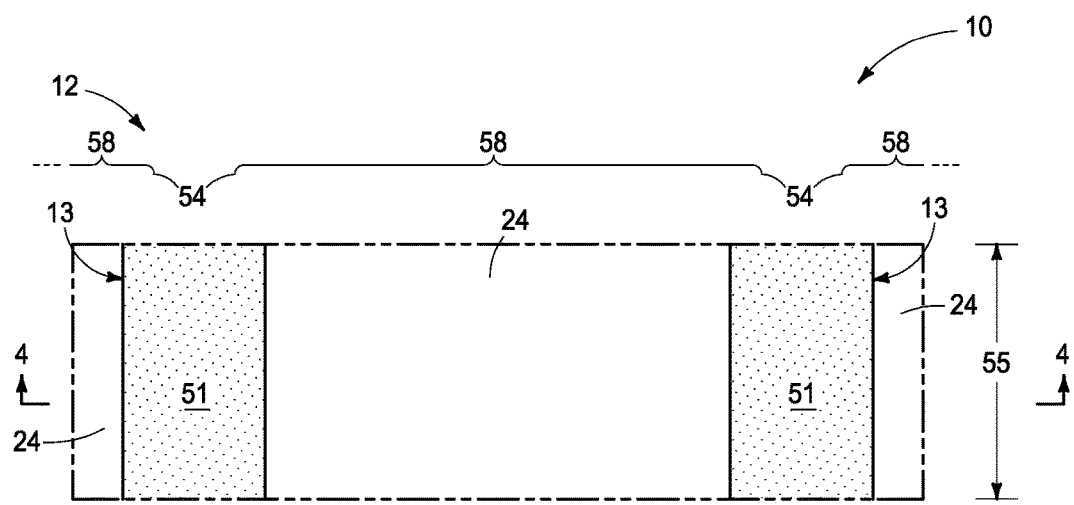
FIGS. 3-22 are diagrammatic sequential sectional and/or enlarged views of the construction of FIGS. 1 and 2, or portions thereof or alternate and/or additional embodiments, in process in accordance with some embodiments of the invention.
Figure 4:
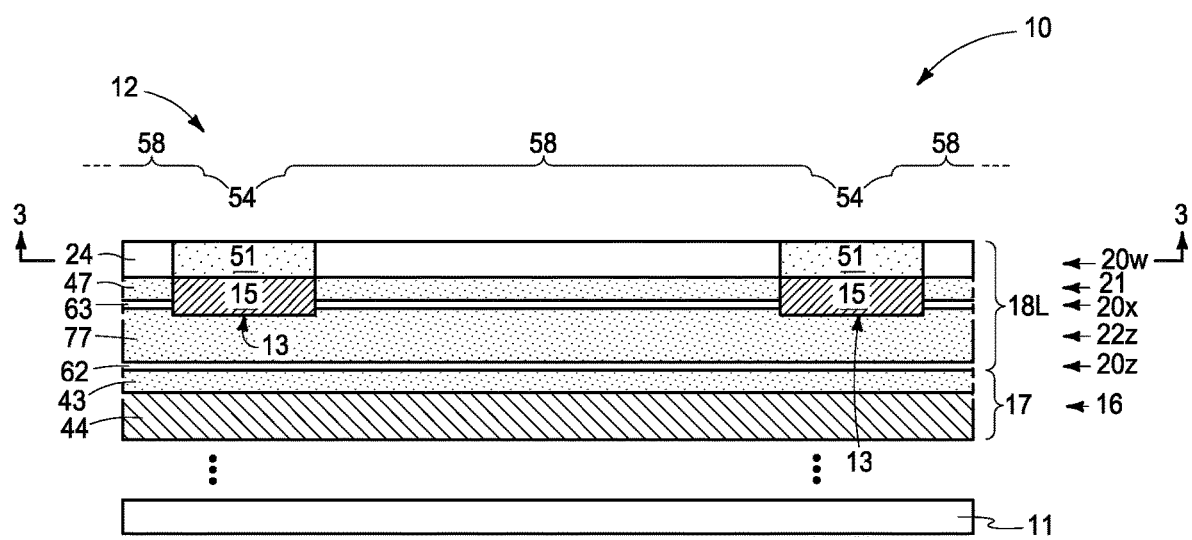

Referring to FIGS. 3 and 4, and in one embodiment, horizontally-elongated line material 51 has been formed in upper second tier 20w longitudinally-along and to bridge laterally-between opposing lateral edges 54 of immediately-adjacent memory-block regions 58, with line material 51 being of different composition from that of insulative material 24 in upper second tier 20w that is laterally-between line material 51. For example, outermost material of sacrificial rails 13 (when present) may be etched back selectively relative to insulative material 24 followed by overfilling the cavity formed thereby with line material 51 which is then planarized back at least to the outermost surface of material 24. Accordingly, and regardless, in one embodiment, line material 51 is formed directly above sacrificial rails 13. Line material 51 may be insulative, semiconductive, and/or conductive. In one embodiment, line material 51 comprises at least one of hafnium oxide, doped silicon dioxide, carbon-doped silicon nitride, boron-doped silicon, carbon, and elemental boron. With respect to "doped", an example dopant concentration in the doped material is 0.05 to 30.0 atomic percent (e.g., 1.0 to 30.0 atomic percent; e.g., 1.0 to 10.0 atomic percent).

Referring to FIGS. 5-8, vertically-alternating different-composition first tiers 22U and second tiers 20U of an upper portion 18U of stack 18* have been formed above lower portion 18L and line material 51. First tiers 22U may be conductive and second tiers 201 may be insulative (e.g., comprising silicon dioxide 24), yet need not be so at this point of processing in conjunction with the hereby initially-described example method embodiment which is "gate-last" or "replacement-gate". Example upper portion 18U is shown starting above lower portion 18L with a first tier 22U (e.g., comprising sacrificial silicon nitride 26) although such could alternately start with a second tier 20U (not shown). Further, and by way of example, lower portion 18L may be formed to have one or more first and/or second tiers as a top thereof. Regardless, only a small number of tiers 20U and 22U is shown, with more likely upper portion 18U (and thereby stack 18*) comprising dozens, a, hundred or more, etc. of tiers 20* and 22*. Further, other circuitry that may or may not be part of peripheral and/or control circuitry may be between conductor tier 16 and stack 18*. By way of example only, multiple vertically-alternating tiers of conductive material and insulative material of such circuitry may be below a lowest of conductive tiers 22* and/or above an uppermost of conductive tiers 22*. For example, one or more select gate tiers (not shown) may be between conductor tier 16 and the lowest conductive tier 22* and one or more select gate tiers may be above an uppermost of conductive tiers 22*. Alternately or additionally, at least one of the depicted uppermost and lowest conductive tiers 22* may be a select gate tier.

Channel openings 25 have been formed (e.g., by etching) through second tiers 20* and first tiers 22* in upper portion 18U to lower portion 18L (e.g., at least to lowest first tier 22z in lower portion 18L). Channel openings 25 may taper radially-inward (not shown) moving deeper into stack 18. In some embodiments, channel openings 25 may go into conductor material 17 of conductor tier 16 as shown or may stop there-atop (not shown). Alternately, as an example, channel openings 25 may stop atop or within the lowest second tier 20z. A reason for extending channel openings 25 at least to conductor material 17 of conductor tier 16 is to provide an anchoring effect to material that is within channel openings 25. Etch-stop material (not shown) may be within or atop conductive material 17 of conductor tier 16 to facilitate stopping of the etching of channel openings 25 relative to conductor tier 16 when such is desired. Such etch-stop material may be sacrificial or non-sacrificial.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

In one embodiment and as shown, charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18* and within individual openings 25 followed by planarizing such back at least to a top surface of stack 18*.

Channel material 36 as a channel-material string 53 has also been formed in channel openings 25 elevationally along insulative tiers 20 and conductive tiers 22. Materials 30, 32, 34, and 36 are collectively shown and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against conductor material 17 of conductor tier 16. Such punch etching may occur separately with respect to each of materials 30, 32, and 34 (as shown) or may occur with respect to only some (not shown). Alternately, and by way of example only, no punch etching may be conducted and channel material 36 may be directly electrically coupled to conductor material 17 of conductor tier 16 only by a separate conductive interconnect. (not yet shown). Regardless, sacrificial etch-stop plugs (not shown) may be formed in lower portion 18L in horizontal locations where channel openings 25 will be prior to forming upper portion 18U. Channel openings 25 may then be formed by etching materials 24 and 26 to stop on or within the material of the sacrificial plugs, followed by exhuming remaining material of such plugs prior to forming material in channel openings 25. A radially-central solid dielectric material 38 (e.g., spin-on-dielectric, silicon dioxide, and/or silicon nitride) is shown in channel openings 25. Alternately, and by way of example only, the radially-central portion within channel openings 25 may include void space(s) (not shown) and/or be devoid of solid material (not shown).

Horizontally-elongated trenches 40 have been formed (e.g., by anisotropic etching) into stack 18* through upper portion 18U to lower portion 18L and that are individually between immediately-laterally-adjacent memory-block regions 58. Trenches 40 have been formed to extend through upper portion 18U and in one embodiment as shown through line material 51 to form horizontally-elongated lines 75 in upper second tier 20w longitudinally-along opposing lateral edges 54 of memory-block regions 58, In one embodiment and as shown, lines 75 are within memory-block regions 58. Trenches 40 may extend to sacrificial rails 13 (when present) and, if so, such may provide an etch stopping function when trenches 40 are formed by etching, whereby such etching is conducted selectively relative to material 15 of sacrificial rails 13. Trenches 40 may taper laterally-inward or laterally-outward moving deeper into stack 18* (not shown). By way of example and for brevity only, channel openings 25 are shown as being arranged in groups or columns of staggered rows of four and five channel openings 25 per row. No channel openings 25 are shown in the laterally-outer memory-block regions 58 for ease of depiction. Alternately, by way of example, the rows of four could alternate with the rows of five in immediately-laterally-adjacent memory-block regions 58 whereby no channel openings would be visible in the laterally-outer memory-block regions 58 in the depicted cross-sections. Trenches 40 will typically be wider than channel openings 25 (e.g., 10 to 20 times wider, yet such wider degree not being shown for brevity). Any alternate existing or future-developed arrangement and construction may be used. Trenches 40 and channel openings 25 may be formed in any order relative the other or at the same time.

Figure 9:
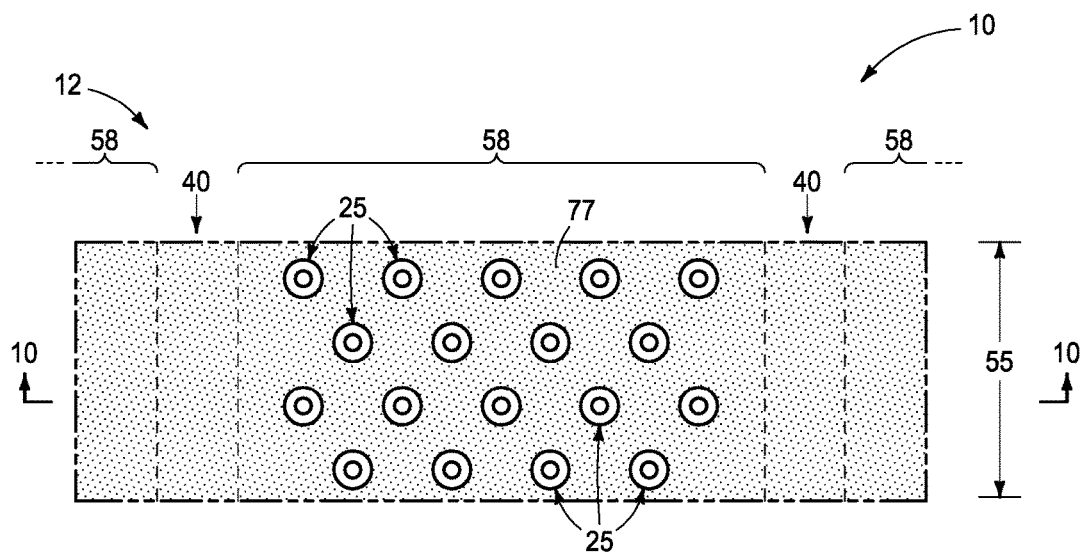
Figure 10:
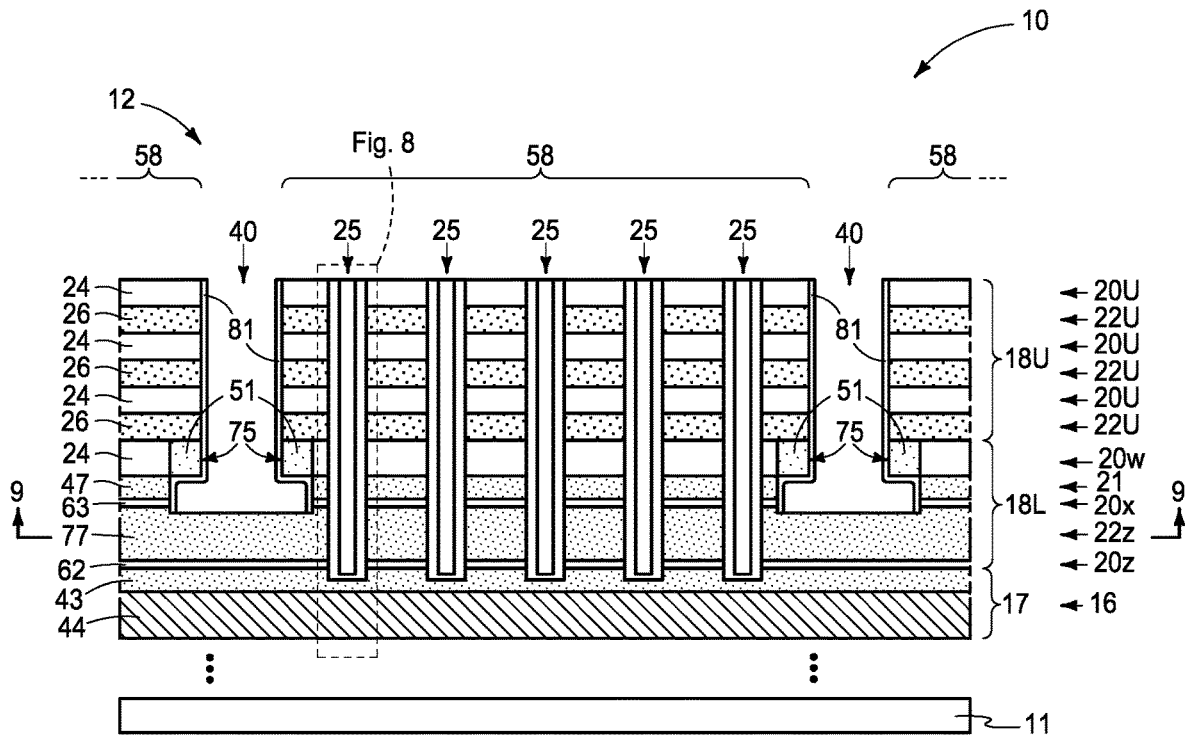

Referring to FIGS. 9 and 10, trenches 40 extend to lowest first tier 22z and expose sacrificial material 77 therein. For example, when sacrificial rails 13 are present (not shown in FIGS. 9 and 10), such may be removed after etching through line material 51 (e.g., by isotropic etching, for example using a mixture of ammonia and hydrogen peroxide or a mixture of sulfuric acid and hydrogen peroxide if material 15 of sacrificial rails 13 comprises elemental W). An optional thin sacrificial liner 81 (e.g., hafnium oxide, aluminum oxide, multiple layers of the same or other materials, [e.g., silicon dioxide and silicon nitride] etc.) has then be formed in trenches 40, followed by punch-etching therethrough to expose material 77. Thereby, and as one example, trenches 40 have been formed to extend to sacfificial material 77.

Figure 11:
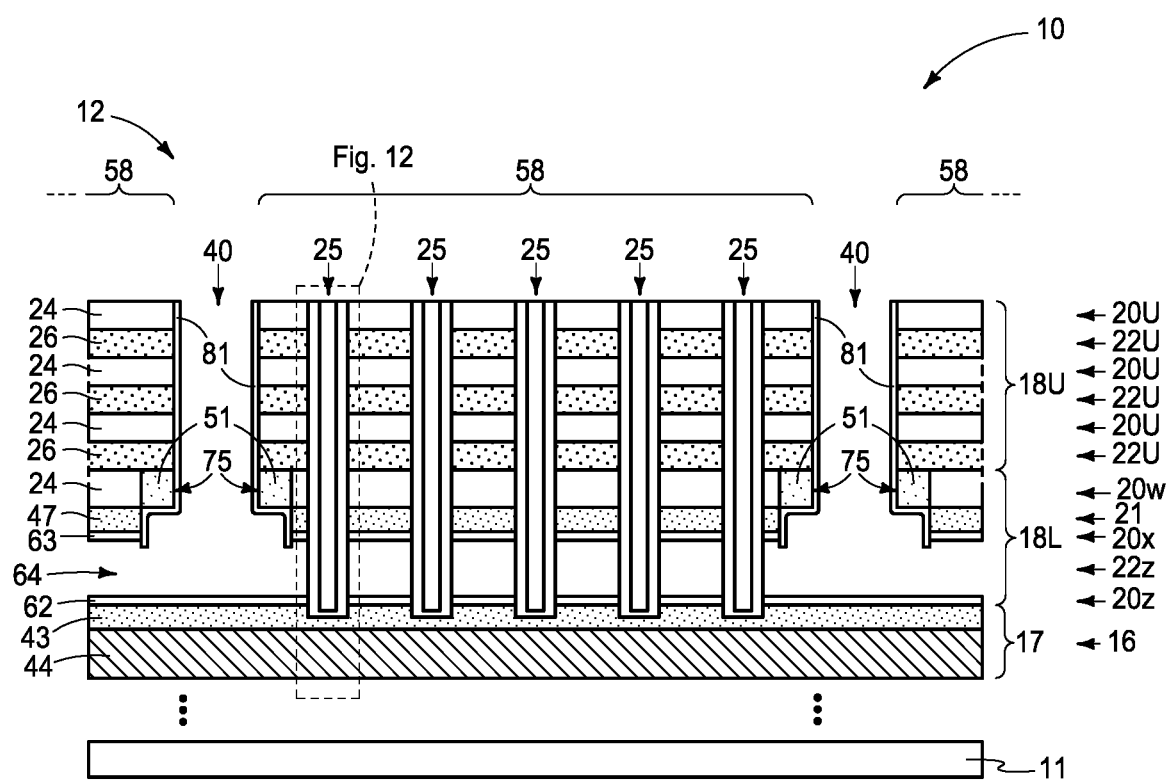
Figure 12:
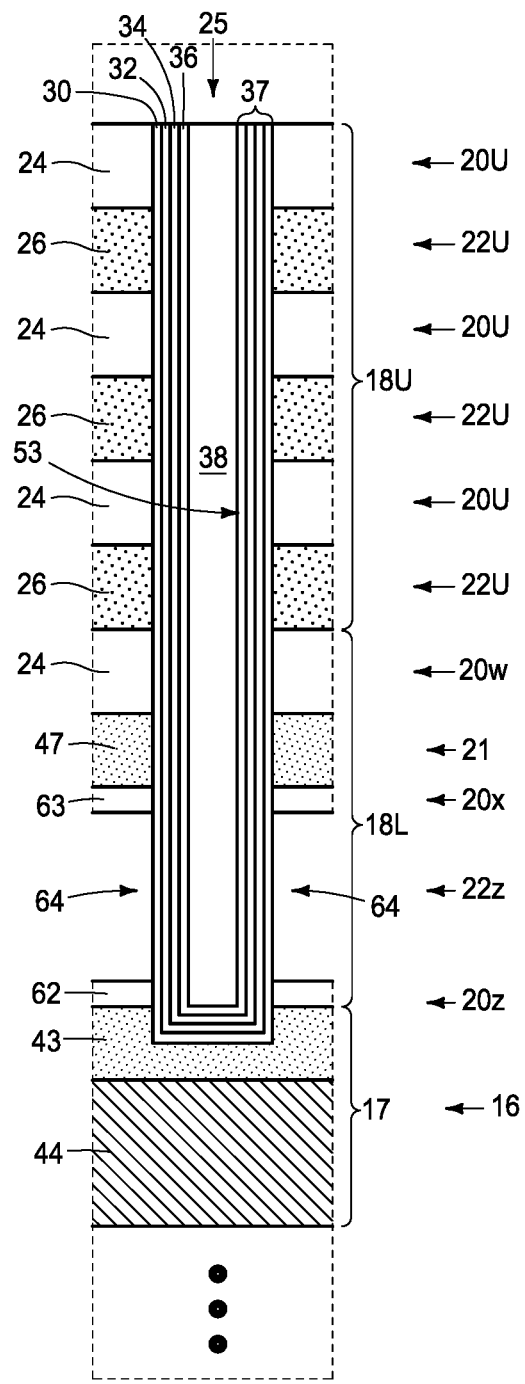

Referring to FIGS. 11 and 12, material 77 (not shown) has been removed (e.g., by isotropic etching) from lowest first tier 22z through trenches 40, thus leaving or forming a void space 64 vertically between lowest second tier 20z and next-lowest second tier 20x. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon.

Figure 13:
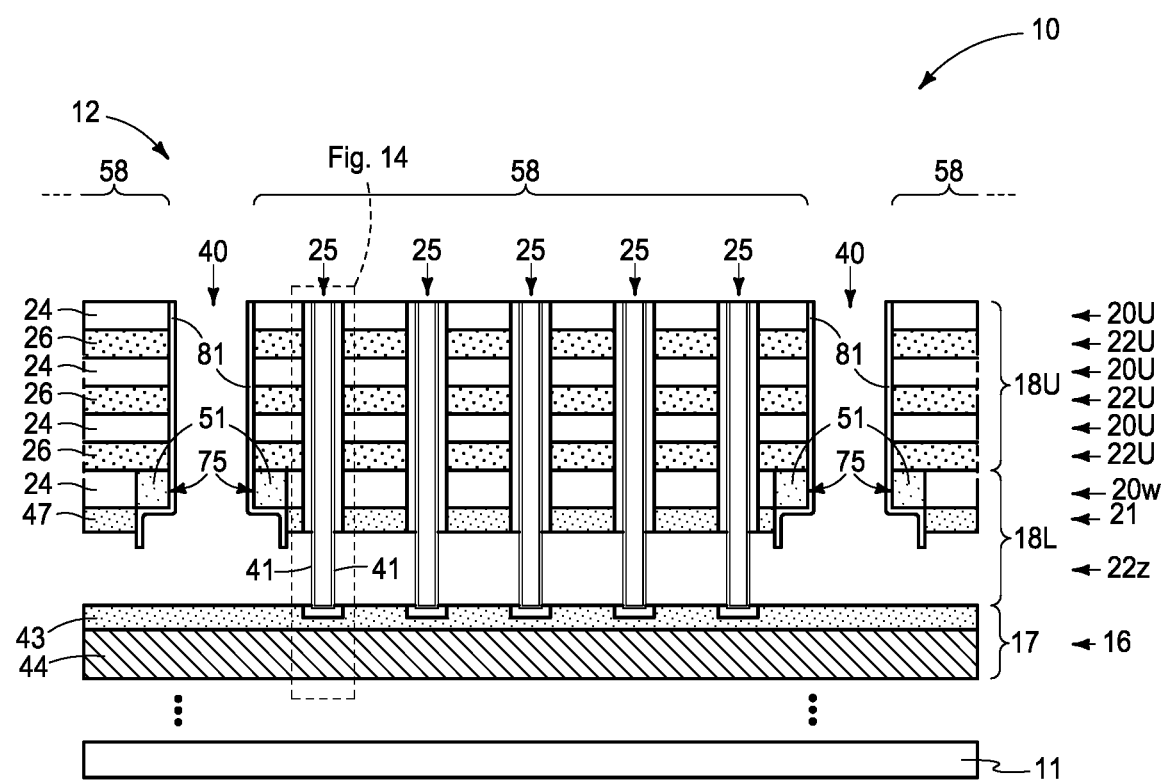
Figure 14:
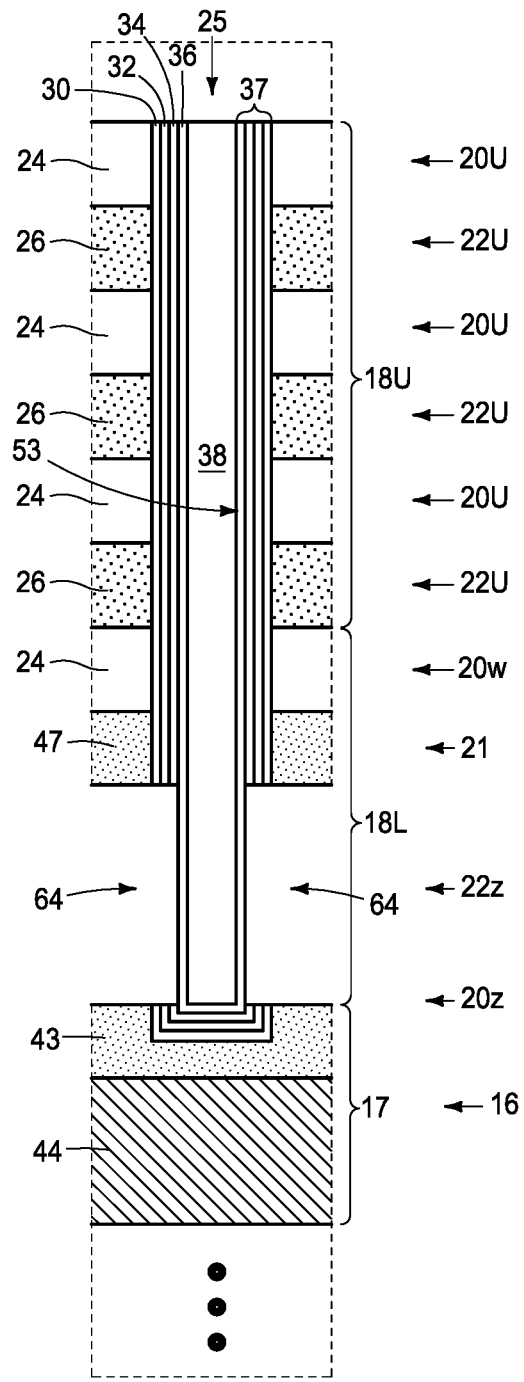

FIGS. 13 and 14 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z, Any of materials 30, 32, and 34 in tier 22z may be considered as being sacrificial material therein. As an example, consider an embodiment where liner 81 is one or more insulative oxides (other than solely silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment and as shown, such etching has been conducted selectively relative to liner 81 (when present). In one embodiment and as shown, materials 62 and 63 (not shown) have been removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. If liner 81 comprises multiple layers of silicon dioxide and silicon nitride, such may be removed (not shown) commensurate with removal (e.g., by etching) of materials 30, 32, 34, 62, and 63 where such collectively each comprise one of silicon nitride and silicon dioxide.

Figure 15:
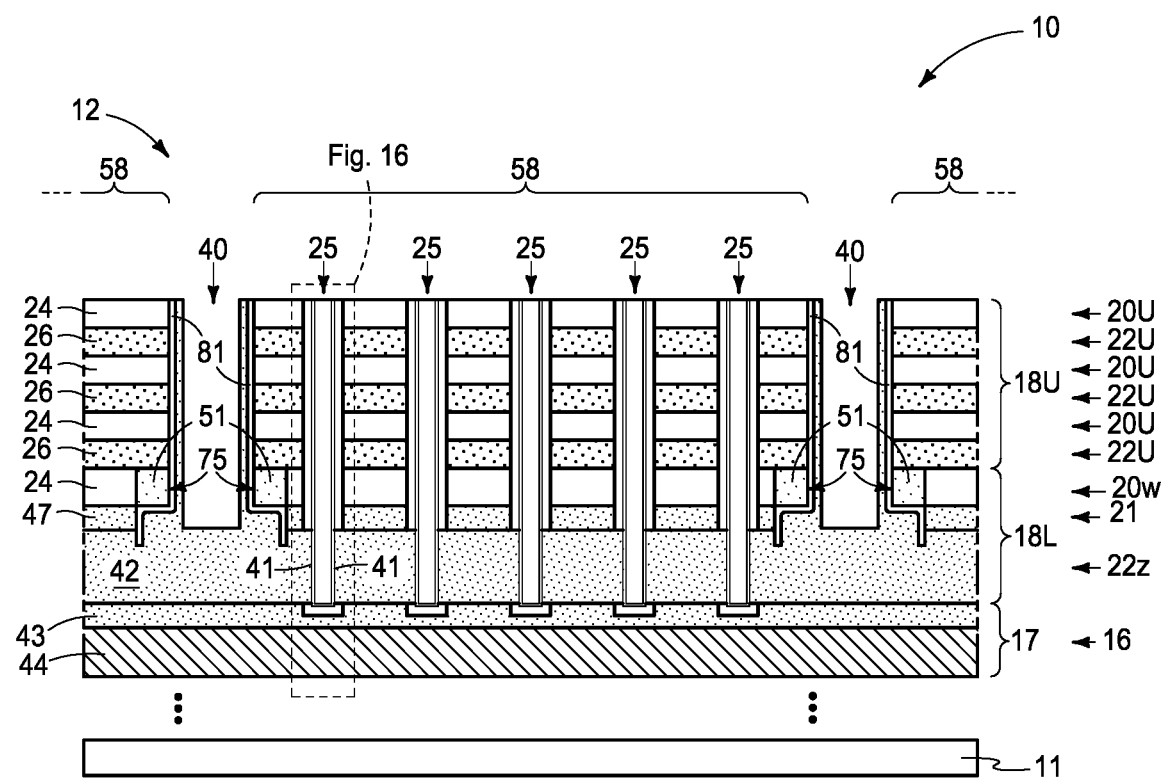
Figure 16:
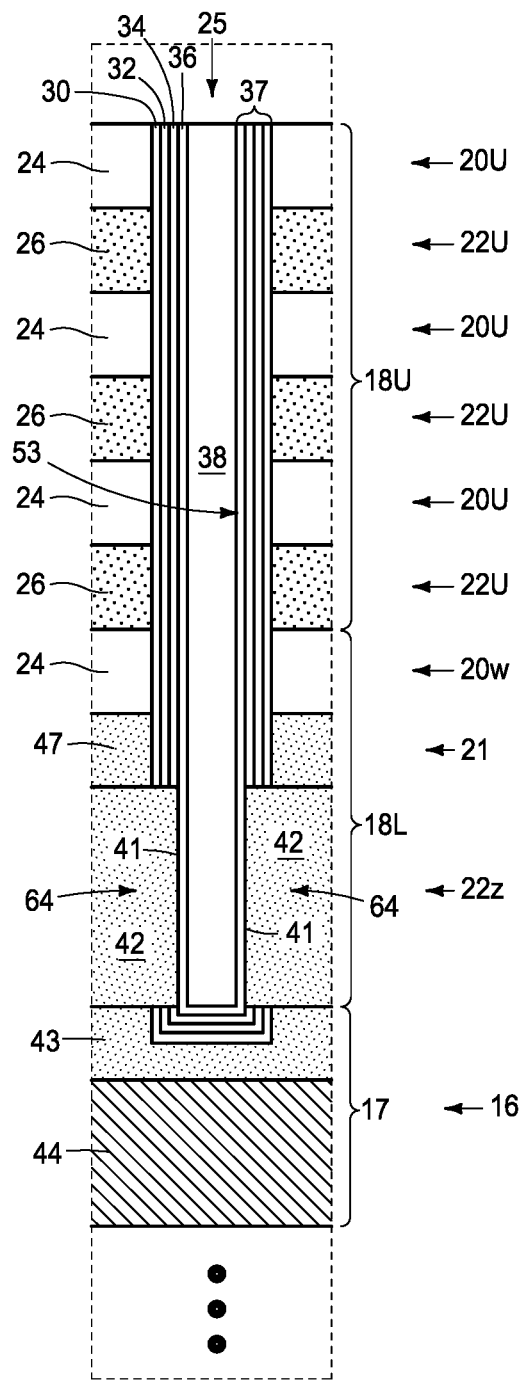
Figure 17:
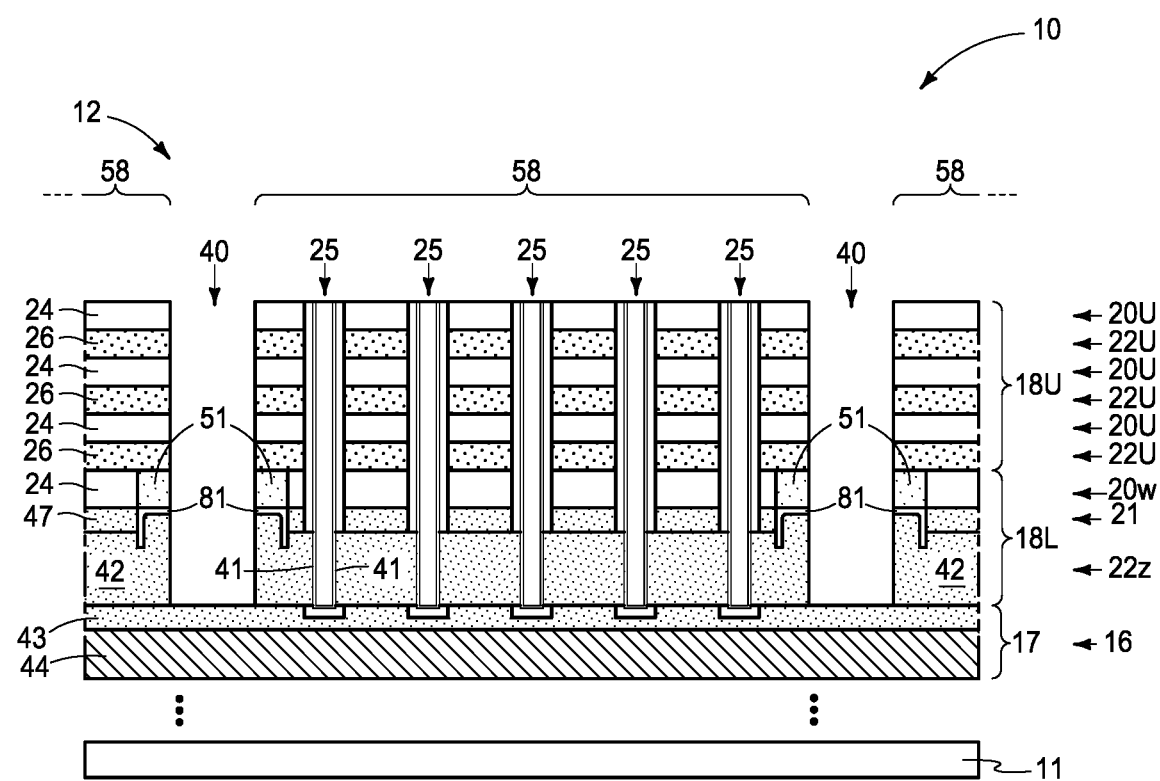
Figure 18:
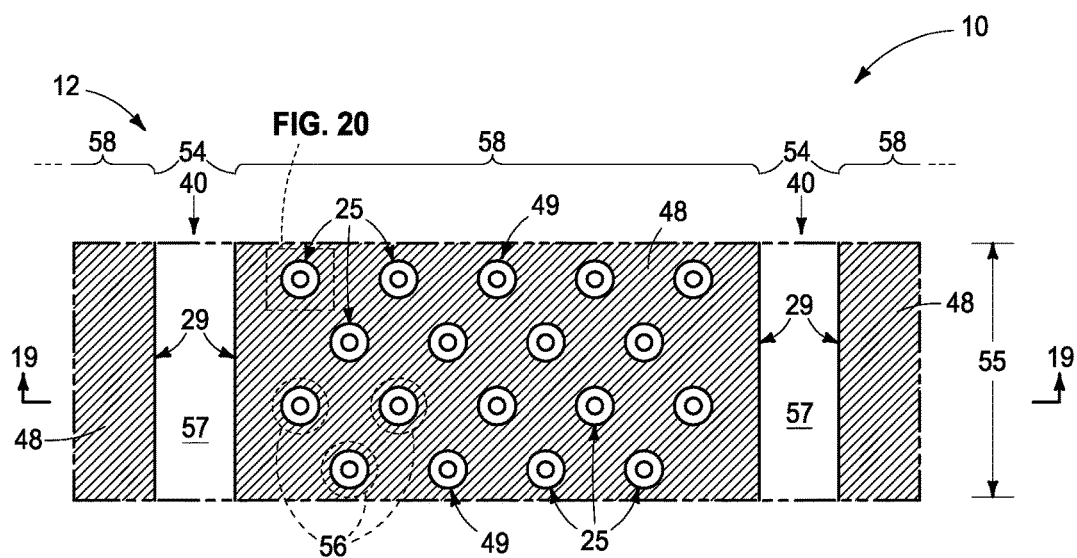
Figure 19:
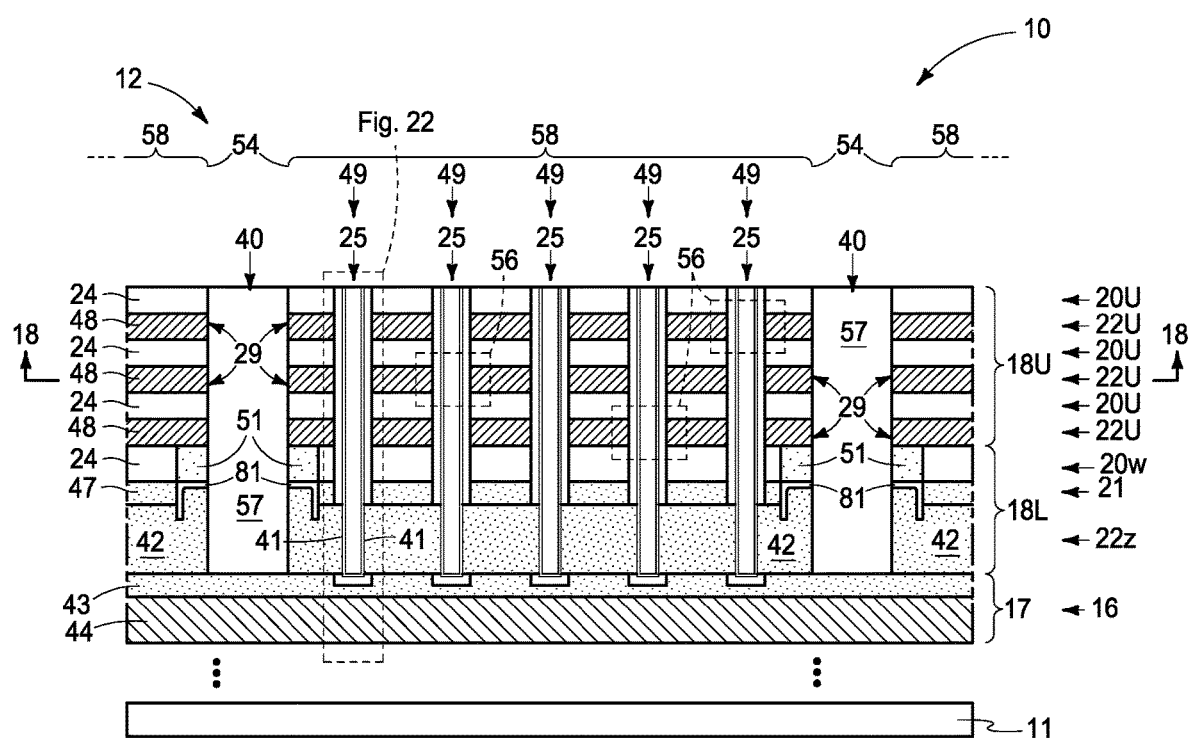
Figure 20:
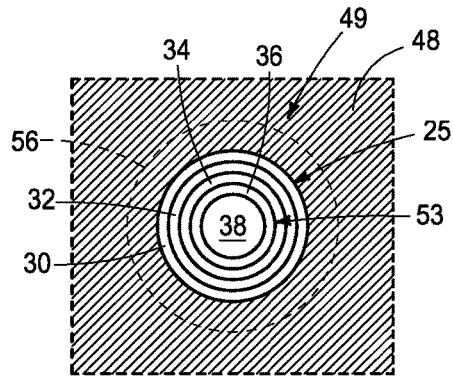
Figure 21:
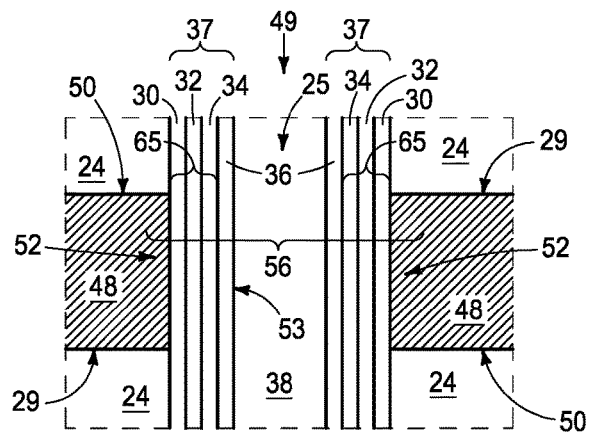
Figure 22:
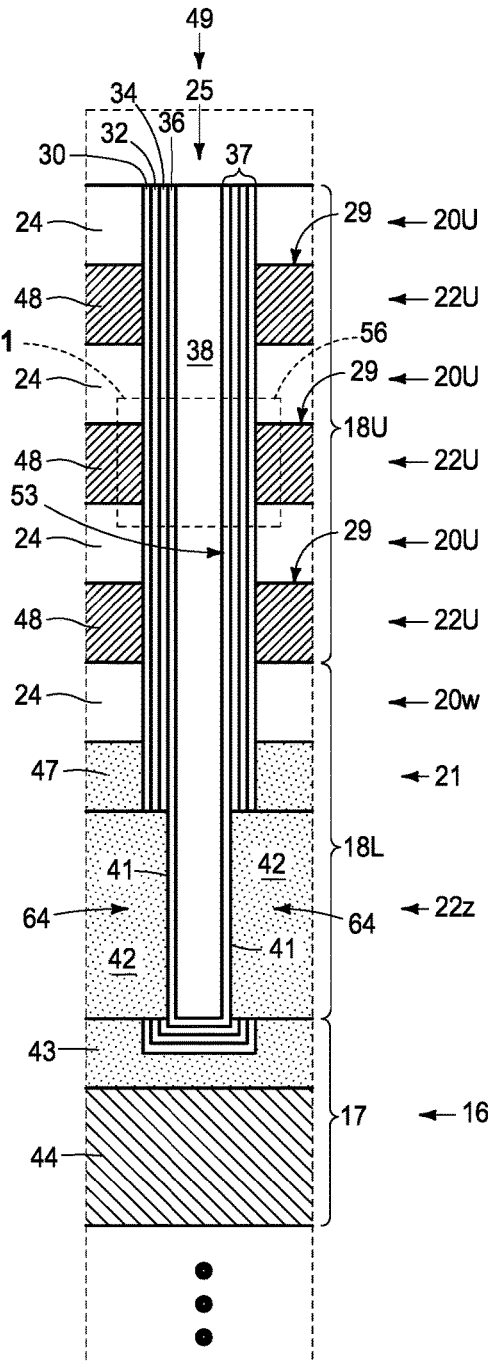

Referring to FIGS. 15 and 16, conducting material 42 (e.g., conductively-doped polysilicon) has been formed in lowest first tier 22z and in one embodiment directly against sidewall 41 of channel material 36, In one embodiment and as shown, such has been formed directly against a bottom of conducting material 47 of conducting tier 21 and directly against a top of conductor material 43 of conductor tier 16, thereby directly electrically coupling together channel material 36 of individual channel-material strings 53 with conductor material 43 of conductor tier 16 and conducting material 47 of conducting tier 21. FIG. 17 shows subsequent removal of conducting material 42 from trenches 40 and removal of sacrificial liner 81 from upper portion 18U and tier 20w. Sacrificial liner 81 may be removed before forming conducting material 42 (not shown).

Lines 75 may remain in a finished construction of the memory array. Alternately, all of the line material may be removed after the isotropically etching of sacrificial material 77 such that lines 75 do not remain in a finished construction of the memory array. For example, if lines 75 are semiconductive or conductive, it will likely be desirable to remove such lines to avoid inadvertent shorts (e.g, before forming conducting material 42).

Referring to FIGS. 18-22, material 26 (not shown) of conductive tiers 22U has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22U in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22* is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g, floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and in void space that is left by the removing of the material 15 of sacrificial rails 13 as shown in FIG. 10, and thereby laterally-between and longitudinally-along immediately-laterally-adjacent memory blocks 58, Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (not shown).

Figure 5:
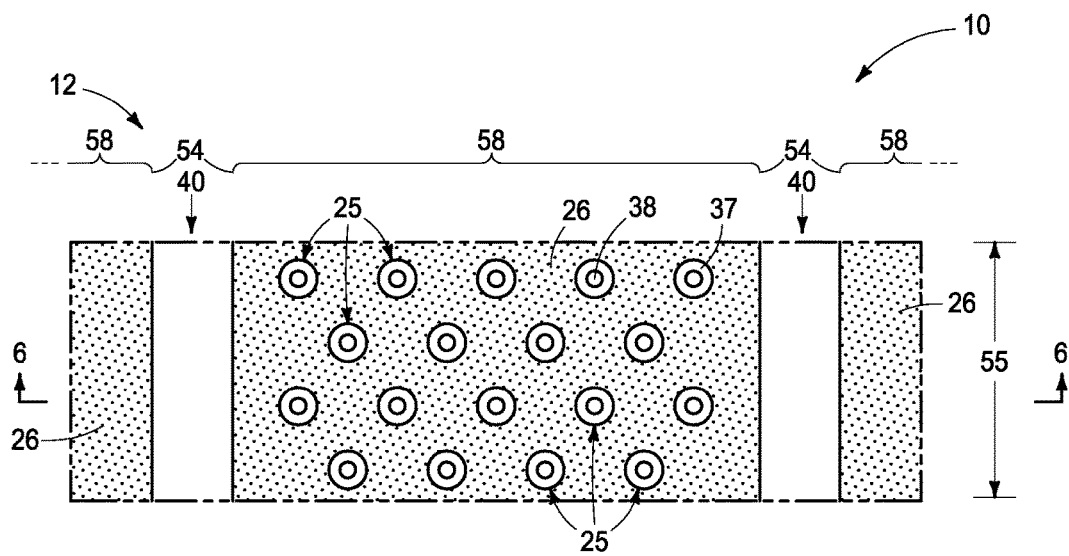
Figure 6:
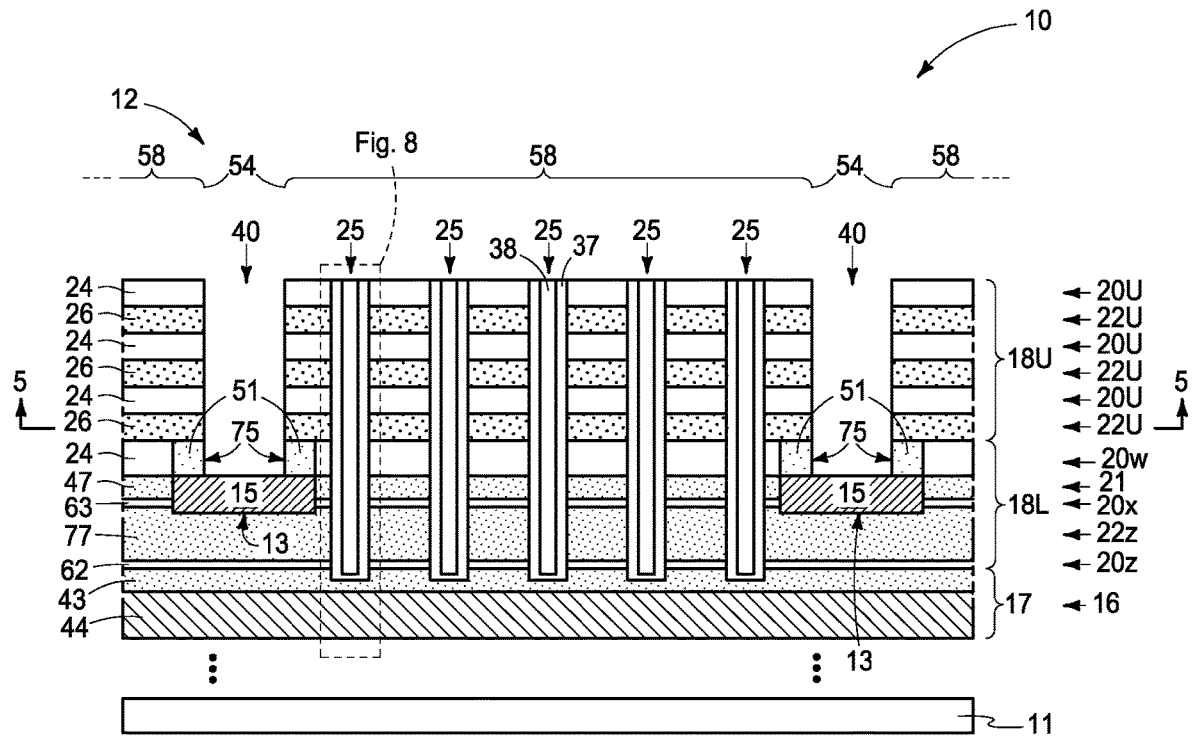
Figure 7:
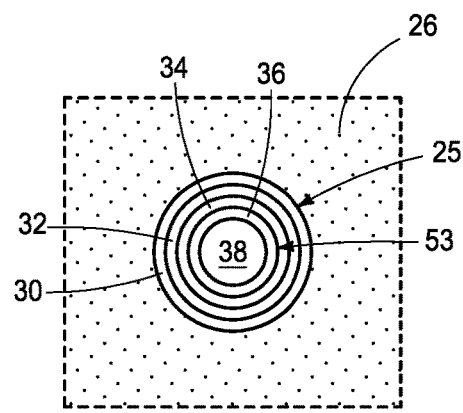
Figure 8:
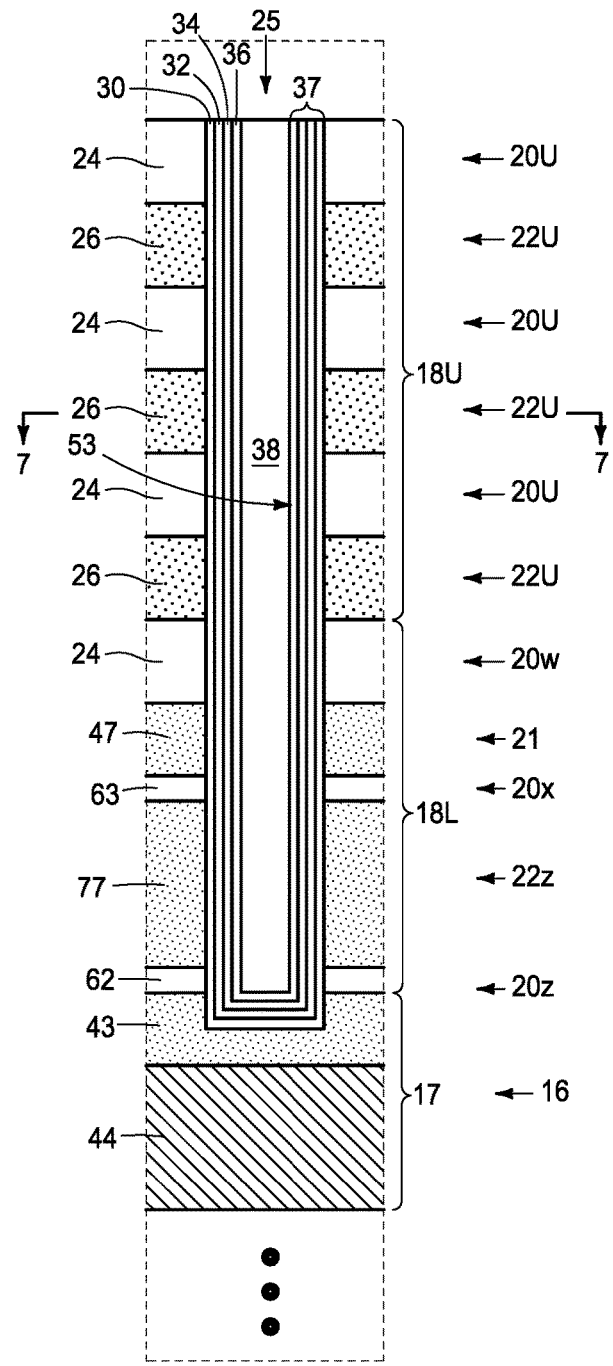

The above is but one example method of forming lines 75. Alternate methods may be used. For example, and by way of example only and not shown, material 24 of tier 20w could initially be made thicker than shown in FIG. 6. Then, openings could be formed through tiers 20w, 21, and 20x that are individually of the same outline and shape as, but narrower than, sacrificial rails 13 as shown in FIGS. 1 and 2. Sacrificial rails 13 could then be formed to have tops that are below tier 20w. Material 24 of tier 20w could then be subjected to an isotropic etch to widen such openings and reduce thickness of material 24/tier 20w. Line material 51 could then be formed in the widened openings and planarized back to have top surfaces that are elevationally-coincident with top surfaces of reduced-thickness material 24/tier 20w. Processing could then occur as shown in FIGS. 5+.

The invention was motivated in reducing risk of shorts between conductor tier 16 and lowest conductive tier 22U in upper stack 18U. For example, etching as shown in FIGS. 13 and 14 may undesirably etch some of material 24 in lowest insulative tier 20U, thereby exposing lowest conductive tier 22U, particularly where material 24 and at least some of materials 30, 32, and 34 are silicon dioxide. Presence of lines 75 may block or at least reduce such etching action of lowest insulative tier 22U, thereby reducing or eliminating such risk. Accordingly, and in one embodiment, silicon dioxide is laterally-outward of channel-material strings 53 and, after the isotropically etching of exposed sacrificial material 77 from lowest first tier 22z and before forming conductive material 42, such silicon dioxide is etched selectively relative to any exposed line material 51.

Any other attribute(s) or aspect(s) as shown and/or described herein with respect to other embodiments may be used in the embodiments shown and described with reference to the above embodiments.

An embodiment of the invention includes a method used in forming a memory array (e.g., 12) comprising strings (e.g., 49) of memory cells (e.g., 56) comprising forming a lower portion (e.g., 18L) of a stack (e.g., 18\*) that will comprise vertically-alternating different-composition first tiers (e.g., 22\*) and second tiers 20\*). The stack comprises laterally-spaced memory-block regions (e.g., 58). The lower portion comprises an upper second tier (e.g., 20w) comprising insulative material (e.g., 24). Vertically-alternating first tiers (e.g., 22U) and second tiers (e.g., 20U) of an upper portion (e.g., 18U\*) of the stack is formed above the lower portion. Channel-material strings (e.g., 53) are formed and that extend through the upper portion to the lower portion. Horizontally-elongated lines (e.g., 75) are formed in the upper second tier longitudinally-along opposing lateral edges (e.g., 54) of the memory-block regions. Material (e.g., 51) of the lines is of different composition from that of the insulative material in the upper second tier that is laterally-between the lines. Horizontally-elongated trenches (e.g., 40) have been formed into the stack and that are individually between immediately-laterally-adjacent of the memory-block regions and that extend through the upper portion to the lower portion. In one embodiment, the lines are formed after forming the upper portion and in one such embodiment the lines are formed after forming the trenches. In one embodiment, the lines are within the memory-block regions. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18\*) comprising alternating insulative tiers (e.g., 20\*) and conductive tiers (e.g., 22\*) above a conductor tier (e.g., 16). The strings of memory cells comprise channel-material strings (e.g., 53) that extend through the insulative tiers and the conductive tiers. The channel-material strings directly electrically coupling to conductor material (e.g., 17) of the conductor tier. The insulative tier (e.g., 20w) immediately-above a lowest of the conductive tiers (e.g., 22z) comprises horizontally-elongated insulator or semiconductive lines (e.g., 75) longitudinally-along opposing lateral edges (e.g., 54) of the memory blocks. Material (e.g., 51) of the insulator or semiconductive lines is of different composition from that of the insulative material (e.g., 24) that is in the memory blocks laterally-between the insulator lines in the insulative tier that is immediately-above the lowest conductive tier. Intervening material (e.g., 57) is laterally-between and longitudinally-along immediately-laterally-adjacent of the memory blocks.

In one embodiment, the insulator or semiconductive lines are insulator lines and in another embodiment are semiconductive lines. In one embodiment, the material of the insulator or semiconductive lines comprises at least one of hafnium oxide, doped silicon dioxide, carbon-doped silicon nitride, boron-doped silicon, carbon, and elemental boron. In one such latter embodiment, the insulative material comprises silicon dioxide and that in one embodiment is undoped.

Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack e.g., 18\*) comprising alternating insulative tiers (e.g., 20\*) and conductive tiers e.g., 22\*) above a conductor tier (e.g., 16). The strings of memory cells comprise channel-material strings (e.g., 53) that extend through the insulative tiers and the conductive tiers. The channel-material strings directly electrically coupling to conductor material (e.g., 17) of the conductor tier. Conducting material (e.g., 42) of a lowest of the conductive tiers (e.g., 22z) is directly against the conductor material of the conductor tier and is directly against the channel material (e.g., 36) of individual of the channel-material strings. Intervening material (e.g., 57) is laterally-between and longitudinally-along immediately-laterally-adjacent of the memory blocks. The insulative tier (e.g., 20w) immediately-above the lowest conductive tier comprises horizontally-elongated insulator or semiconductive lines (e.g., 75) longitudinally-along opposing lateral edges (e.g., 54) of the memory blocks. Material (e.g., 51) of the insulator or semiconductive lines is of different composition from that of the insulative material (e.g., 24) that is in the memory blocks laterally-between the insulator lines in the insulative tier that is immediately-above the lowest conductive tier. Intervening material (e.g., 57) is laterally-between and longitudinally-along immediately-laterally-adjacent of the memory blocks. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on". "adjacent", "along", and "against" not preceded by "directly" encompass "directly against" as well as construction where intervening material(s), region (s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/conducting materials herein may be metal material and/or conductively-doped semiconductive/semiconductor/semiconducting material "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a lower portion of a stack that will comprise vertically-alternating first tiers and second tiers. The stack comprises laterally-spaced memory-block regions. Material of the first tiers is of different composition from material of the second tiers. The lower portion comprises an upper second tier comprising insulative material. The vertically-alternating first tiers and second tiers of an upper portion of the stack are formed above the lower portion. Channel-material strings are formed that extend through the upper portion to the lower portion. Horizontally-elongated lines are formed in the upper second tier longitudinally-along opposing lateral edges of the memory-block regions. Material of the lines is of different composition from that of the insulative material in the upper second tier that is laterally-between the lines. Horizontally-elongated trenches are formed into the stack that are individually between immediately-laterally-adjacent of the memory-block regions and that extend through the upper portion to the lower portion.

In some embodiments, a method used in forming a memory array comprising strings of memory cells comprises forming a conductor tier comprising conductor material on a substrate. A lower portion of a stack is formed that will comprise vertically-alternating first tiers and second tiers above the conductor tier. The stack comprises laterally-spaced memory-block regions. Material of the first tiers is of different composition from material of the second tiers. A lowest of the first tiers comprises sacrificial material. The lower portion comprises an upper second tier comprising insulative material. Horizontally-elongated line material is formed in the upper second tier longitudinally-along and to bridge laterally-between opposing lateral edges of immediately-adjacent of the memory-block regions. The line material is of different composition from that of the insulative material in the upper second tier that is laterally-between the line material. The vertically-alternating first tiers and second tiers of an upper portion of the stack are formed above the lower portion and the line material. Channel-material strings are formed that extend through the upper portion to the lowest first tier in the lower portion. Horizontally-elongated trenches are formed into the stack that are individually laterally-between immediately-laterally-adjacent of the memory-block regions. The trenches are formed to extend through the upper portion and through the line material to form horizontally-elongated lines in the upper second tier longitudinally-along the opposing lateral edges of the memory-block regions. The trenches extend to the lowest first tier and expose the sacrificial material therein. The exposed sacrificial material is isotropically etched from the lowest first tier through the trenches. After the isotropic etching, conductive material is formed in the lowest first tier that directly electrically couples together the channel material of individual of the channel-material strings and the conductor material of the conductor tier.

In some embodiments, a memory array comprising strings of memory cells comprises laterally-spaced memory blocks that individually comprise a vertical stack comprising alternating insulative tiers and conductive tiers above a conductor tier. The strings of memory cells comprise channel-material strings that extend through the insulative tiers and the conductive tiers. The channel-material strings directly electrically couple to conductor material of the conductor tier. The insulative tier immediately-above a lowest of the conductive tiers comprises horizontally-elongated insulator or semiconductive lines longitudinally-along opposing lateral edges of the memory blocks. Material of the insulator or semiconductive lines is of different composition from that of the insulative material that is in the memory blocks laterally-between the insulator lines in the insulative tier that is immediately-above the lowest conductive tier. Intervening material is laterally-between and longitudinally-along immediately-laterally-adjacent of the memory blocks.

In some embodiments, a memory array comprising strings of memory cells comprises laterally-spaced memory blocks that individually comprise a vertical stack comprising alternating insulative tiers and conductive tiers above a conductor tier. The strings of memory cells comprise channel-material strings that extend through the insulative tiers and the conductive tiers. The channel-material strings directly electrically couple to conductor material of the conductor tier. Conducting material of a lowest of the conductive tiers is directly against the conductor material of the conductor tier and is directly against the channel material of individual of the channel-material strings. The insulative tier immediately-above the lowest conductive tier comprises horizontally-elongated insulator or semiconductive lines longitudinally-along opposing lateral edges of the memory blocks. Material of the insulator or semiconductive lines is of different composition from that of the insulative material that is in the memory blocks laterally-between the insulator lines in the insulative tier that is immediately-above the lowest conductive tier. Intervening material laterally-between and longitudinally-along immediately-laterally-adjacent of the memory blocks.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a conductor tier comprising conductor material on a substrate;
    forming a lower portion of a stack that will comprise vertically-alternating first tiers and second tiers above the conductor tier, the stack comprising laterally-spaced memory-block regions, material of the first tiers being of different composition from material of the second tiers, the lower portion having an uppermost source tier, the lower portion comprising an upper second tier above the uppermost source tier and comprising insulative material;
    forming the vertically-alternating first tiers and second tiers of an upper portion of the stack above the lower portion, and forming channel-material strings that extend through the upper portion and through the upper second tier to the uppermost source tier of the lower portion;
    forming horizontally-elongated lines in the upper second tier above the uppermost source tier and longitudinally-along opposing lateral edges of the memory-block regions, material of the lines being of different composition from that of the insulative material in the upper second tier that is laterally-between the lines;
    forming horizontally-elongated trenches into the stack that are individually between immediately-laterally-adjacent of the memory-block regions and that extend through the upper portion to the lower portion; and
    directly electrically coupling channel material of the channel-material strings with conductive material that is in the uppermost source tier and with the conductor material that is in the conductor tier.

2. The method of claim 1 wherein the upper second tier is the uppermost tier in the lower portion.

3. The method of claim 1 wherein the material of the lines is insulative.

4. The method of claim 1 wherein the material of the lines is semiconductive.

5. The method of claim 4 comprising removing the lines after forming the trenches.

6. The method of claim 1 wherein the material of the lines is conductive.

7. The method of claim 6 wherein the conductive material comprises metal material.

8. The method of claim 6 comprising removing the lines after forming the trenches.

9. The method of claim 1 wherein the material of the lines comprises at least one of hafnium oxide, doped silicon dioxide, carbon-doped silicon nitride, boron-doped silicon, carbon, and elemental boron.

10. The method of claim 9 wherein the insulative material comprises silicon dioxide.

11. The method of claim 10 wherein the silicon dioxide is undoped.

12. The method of claim 1 wherein forming the lines comprises:
    forming the material of the lines to bridge between and longitudinally-along the immediately-laterally-adjacent memory-block regions;
    forming the upper portion above the line material; and
    forming the trenches into and through the material of the lines to form the lines therefrom.

13. The method of claim 12 comprising:
    forming sacrificial rails that are individually directly under where individual of the trenches will be formed;
    forming the material of the lines directly above the sacrificial rails;
    the forming the trenches comprising etching through the material of the lines selectively relative to the sacrificial rails; and
    removing the sacrificial rails after the etching.

14. The method of claim 1 comprising forming the lines after forming the upper portion.

15. The method of claim 14 forming the lines after forming the trenches.

16. The method of claim 1 comprising forming the lines within the memory-block regions.

17. The method of claim 1 comprising forming an insulative lining in the horizontally-elongated trenches directly against sidewalls of the horizontally-elongated lines.

18. The method of claim 17 comprising removing the insulative lining from being directly against the sidewalls of the horizontally-elongated lines.

19. The method of claim 17 comprising forming the insulative lining directly against bottoms of the horizontally-elongated lines and in the uppermost source tier.

20. The method of claim 19 comprising removing the insulative lining from being directly against the sidewalls of the horizontally-elongated lines but leaving the insulative lining to be directly against the bottoms of the horizontally-elongated lines and in the uppermost source tier.

21. The method of claim 19 comprising forming the insulative lining that is directly against the bottoms of the horizontally-elongated lines to have a vertically-downward-extending projection in a vertical cross-section that is orthogonal to the horizontally-elongated trenches.

22. The method of claim 21 comprising removing the insulative lining from being directly against the sidewalls of the horizontally-elongated lines but leaving the insulative lining to be directly against the bottoms of the horizontally-elongated lines and in the uppermost source tier and leaving the vertically-downward-extending projection.

* * * * *